US010394228B2

(12) United States Patent
Ohashi

(10) Patent No.: US 10,394,228 B2
(45) Date of Patent: Aug. 27, 2019

(54) COMPONENT MOUNTING LINE CHANGEOVER SUPPORT SYSTEM AND CHANGEOVER SUPPORT METHOD

(71) Applicant: FUJI CORPORATION, Chiryu-shi (JP)

(72) Inventor: Teruyuki Ohashi, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 116 days.

(21) Appl. No.: 15/525,240

(22) PCT Filed: Nov. 26, 2014

(86) PCT No.: PCT/JP2014/081166
§ 371 (c)(1),
(2) Date: May 8, 2017

(87) PCT Pub. No.: WO2016/084143
PCT Pub. Date: Jun. 2, 2016

(65) Prior Publication Data
US 2017/0322548 A1 Nov. 9, 2017

(51) Int. Cl.
*G05B 19/41* (2006.01)
*G05B 19/418* (2006.01)
(Continued)

(52) U.S. Cl.
CPC ..... *G05B 19/41865* (2013.01); *G05B 19/418* (2013.01); *G05B 19/4189* (2013.01);
(Continued)

(58) Field of Classification Search
None
See application file for complete search history.

(56) References Cited

U.S. PATENT DOCUMENTS 5,329,690 A * 7/1994 Tsuji ..................... B23P 21/00 29/430
5,402,564 A * 4/1995 Tsukasaki ............ H05K 13/085 29/832
(Continued)

FOREIGN PATENT DOCUMENTS

JP 2000-59090 A 2/2000
JP 2000-261189 A 9/2000
(Continued)

OTHER PUBLICATIONS

Office Action dated Aug. 13, 2018 in corresponding Japanese Patent Application No. 2016-561124, 2 pages.
(Continued)

*Primary Examiner* — Jason Lin
(74) *Attorney, Agent, or Firm* — Oblon, McClelland, Maier & Neustadt, L.L.P.

(57) ABSTRACT

A combination of batch exchange carts that includes all of the feeders that supply components to be used in the post-changeover production from the multiple batch exchange units prepared in preparation space is decided based on the component information of feeders loaded on batch exchange carts used in the pre-changeover production and setup information of batch exchange carts that can be used for exchange memorized in memory device (component information of feeders loaded on batch exchange carts in preparation space), and then an operator is notified of the decided combination of batch exchange carts by sound or by the display of a mobile terminal or display device of production management computer.

4 Claims, 3 Drawing Sheets

Changeover support program
Acquire list (a) of components used in target job — 101
Acquire setup information (b) for allowable combinations from setup library and current job — 102
Extract combinations (c) that include all components of (a) from (b) — 103
Calculate cycle time for each combination (c) — 104
Decide and display as the optimal combination the combination with the shortest cycle time from each combination from (c) — 105
Display, along with the combination information, the level of commonality with the setup of the previous production, the usage conditions in the upcoming production schedule, the cycle time, the shortest cycle time, and so on for each combination from (c) — 106
End

(51) Int. Cl.

| | |
|---|---|
| ***H05K 13/02*** | (2006.01) |
| ***H05K 13/00*** | (2006.01) |
| ***H05K 13/04*** | (2006.01) |
| ***H05K 13/08*** | (2006.01) |

(52) U.S. Cl.

CPC ......... *H05K 13/0061* (2013.01); *H05K 13/02* (2013.01); *H05K 13/021* (2013.01); *H05K 13/0408* (2013.01); *H05K 13/08* (2013.01); *H05K 13/0857* (2018.08); *G05B 2219/45026* (2013.01); *Y02P 90/02* (2015.11); *Y02P 90/04* (2015.11)

(56) References Cited

U.S. PATENT DOCUMENTS

| | | | | |
|---|---|---|---|---|
| 6,289,582 | B1 * | 9/2001 | Maenishi ............. | H05K 13/085 29/832 |
| 2012/0004762 | A1 | 1/2012 | Bauer et al. | |
| 2017/0208713 | A1 * | 7/2017 | Iisaka .................... | H05K 13/02 |

FOREIGN PATENT DOCUMENTS

| | | | | |
|---|---|---|---|---|
| JP | 2000261189 | A | * | 9/2000 |
| JP | 2001-68890 | A | | 3/2001 |
| JP | 2004-311599 | A | | 11/2004 |
| JP | 2005-159160 | A | | 6/2005 |
| JP | 2005-216965 | A | | 8/2005 |
| JP | 2012-243894 | A | | 12/2012 |
| WO | WO 2010/105876 | A1 | | 9/2010 |
| WO | WO 2013/124959 | A1 | | 8/2013 |

OTHER PUBLICATIONS

Extended European Search Report dated Nov. 16, 2017 in Patent Application No. 1490674213.
International Search Report dated Jan. 27, 2015 in PCT/JP2014/081166 Filed Nov. 26, 2014.

* cited by examiner

COMPONENT MOUNTING LINE CHANGEOVER SUPPORT SYSTEM AND CHANGEOVER SUPPORT METHOD

TECHNICAL FIELD

The present disclosure relates to a component mounting line changeover support system and changeover support method for supporting changeover work of exchanging multiple feeders or multiple suction nozzles set on a component mounter.

BACKGROUND ART

At a component mounting line that mounts components on a circuit board using multiple component mounters lined up along a conveyance path of a circuit board, when the product type of the component mounting board being produced changes, an operator has to perform changeover work of exchanging feeders to feeders that supply components to be used at each component mounter in the post-changeover production, and changeover work of exchanging suction nozzles to suction nozzles that pick up the components and mount them on the circuit board in the post-changeover production. In order to perform this changeover work efficiently, with the changeover support system disclosed in patent literature 1 (JP-A-2005-216965), in a case in which multiple feeders of a component mounter are exchanged as a batch using a batch exchange cart, with respect to multiple batch exchange carts that can be used during changeover, by comparing the pre-changeover feeder arrangement and the post-changeover target feeder arrangement, the work amount of feeder arranging work (exchange work of exchanging feeders loaded on batch exchange carts) during changeover is calculated, and batch changeover carts to be used in the changeover are decided such that the work amount is minimized, with the operator then being notified.

CITATION LIST

Patent Literature

Patent literature 1: JP-A-2005-216965

SUMMARY

With the above patent literature 1, because during changeover it is possible to exchange batch exchange carts set on component mounters for batch exchange carts for which the work amount of feeder arrangement work is minimized, although the work amount of feeder arrangement work performed by an operator during changeover is minimized, as before, an operator must perform feeder arrangement work during changeover, and this still takes time during changeover work, causing lowered productivity.

Also, for a component mounter provided with a function for automatically exchanging suction nozzles, during changeover, when an operator exchanges a nozzle changeover (nozzle station) set with multiple exchange-use suction nozzles, the operator must perform nozzle arrangement work (exchange work of exchanging suction nozzles loaded on the nozzle changer), and this still takes during changeover work, causing lowered productivity.

Therefore, an object of the present disclosure is to provide a component mounting line changeover support system and changeover support method that improves productivity by allowing changeover to be performed with only batch changeover work, without the necessity of performing exchange work of individual feeders or individual suction nozzles during changeover.

To solve the above problems, the current disclosure is a component mounting line changeover support method for a component mounting line that mounts components on a circuit board using multiple component mounters lined up along a conveyance path of a circuit board, the component mounting line changeover support method including: setting a batch exchange unit on each of the multiple component mounters, the batch exchange unit being configured for batch exchanging multiple feeders that supply components or multiple suction nozzles that pick up the components and mount the components on the circuit board; preparing multiple exchange-use batch exchange units to be exchanged with the batch exchange units set on the component mounters; memorizing on a memorizing device setup information that is information of feeders or suction nozzles loaded on each of the multiple exchange-use batch exchange units; and deciding and notifying a combination of batch exchange units that include all of the feeders or suction nozzles to be used in a post-changeover production from among the multiple exchange-use batch exchange units, based on the setup information memorized on the memorizing device that is information of the feeders or suction nozzles loaded on the batch exchange units used in a pre-changeover production. Here, a batch exchange unit device an item such as a batch exchange cart for batch exchanging multiple feeders, a nozzle changer (nozzle station), and so on.

According to the present disclosure, because a combination of batch exchange units that include all of the feeders or suction nozzles to be used in the post-changeover production are decided and notified to an operator from among the prepared exchange-use multiple batch exchange units based on the setup information memorized on the memorizing device that is information of the feeders or suction nozzles loaded on the batch exchange units used in a pre-changeover production, it is not necessary to perform exchange work for individual feeders or individual suction nozzles during changeover (that is, it is fine just to use existing units), and changeover can be performed by just performing batch exchange work of batch exchange units, thereby improving productivity.

With respect to the above, in a case in which there are multiple combinations of batch exchange units that include all of the feeders or suction nozzles to be used in the post-changeover production, the production cycle time may be calculated for each of the combinations, and an optimal combination that is the combination with the shortest cycle time may be decided and notified to an operator. By doing this, because it is possible to perform changeover work with the combination of batch exchange units for which the cycle time in the shortest, it is possible to perform post-changeover production with the shortest cycle time, thereby even further improving productivity.

DESCRIPTION OF EMBODIMENTS

Figure 1:
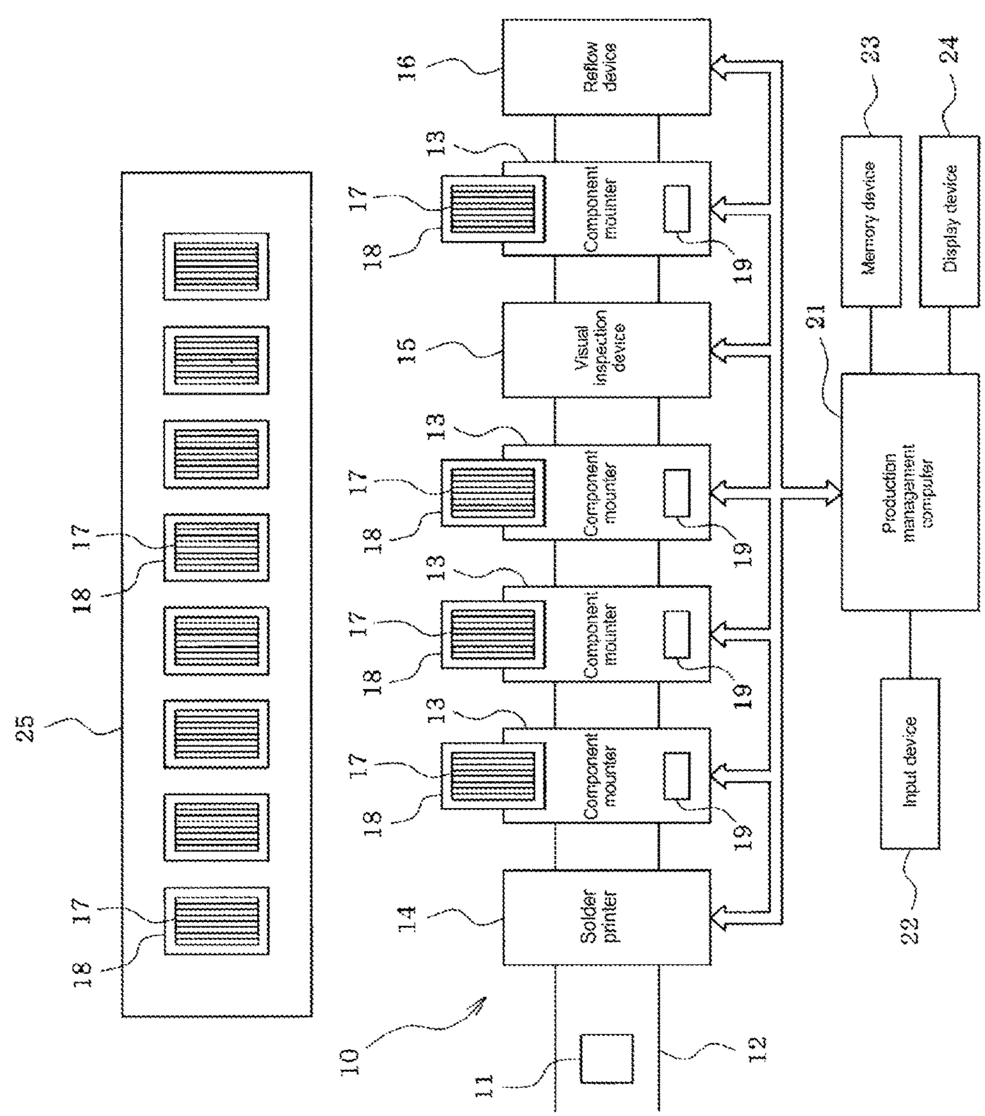
FIG. 1 is a block diagram showing schematically the configuration of a component mounting line which is a first embodiment of the present disclosure.

An embodiment of the disclosure is described below. First, the overall configuration of component mounting line 10 is described based on FIG. 1.

Multiple component mounters 13 that mount components on circuit boards and mounting related machines that perform work related to component mounting (devices other than the component mounters) are lined up along conveyance line 12 (conveyance path) along which circuit board 11 is conveyed. Here, a mounting related machine may be, for example, solder printer 14, visual inspection device 15, reflow device 16, an adhesive applying device, or the like. Visual inspection device 15 captures a mounting state of a component on circuit board 11 or the like with a camera (not shown) and processes the captured image to perform visual inspection. When a defective board is detected by visual inspection device 15, the defective board is discharged by using a defective board unloading conveyer (not shown) that is provided on the outlet side of visual inspection device 15.

Batch exchange cart 18 (batch exchange unit) loaded with multiple feeders 17 that each supply a component is exchangeably provided on each component mounter 13, such that the multiple feeders 17 set on each component mounter 13 can be batch exchanged using batch exchange cart 18. Also, although not shown in the figures, one or multiple suction nozzles that pick up a component supplied from each of the feeders 17 on batch exchange cart 18 and mount the component on circuit board 11 are removably held on a mounting head of each component mounter 13. Nozzle changer 19 (batch exchange unit) on which are loaded multiple exchange-use suction nozzles is exchangeably provided on each component mounter 13, with a suction nozzle held by the mounting head being automatically exchanged for an exchange-use suction nozzle loaded on nozzle changer 19 during production. Also, although not shown in the figures, a camera (mark camera) that images reference marks on circuit board 11, and a camera (component camera) that images a component held by a suction nozzle are loaded on each component mounter 13.

Figure 3:
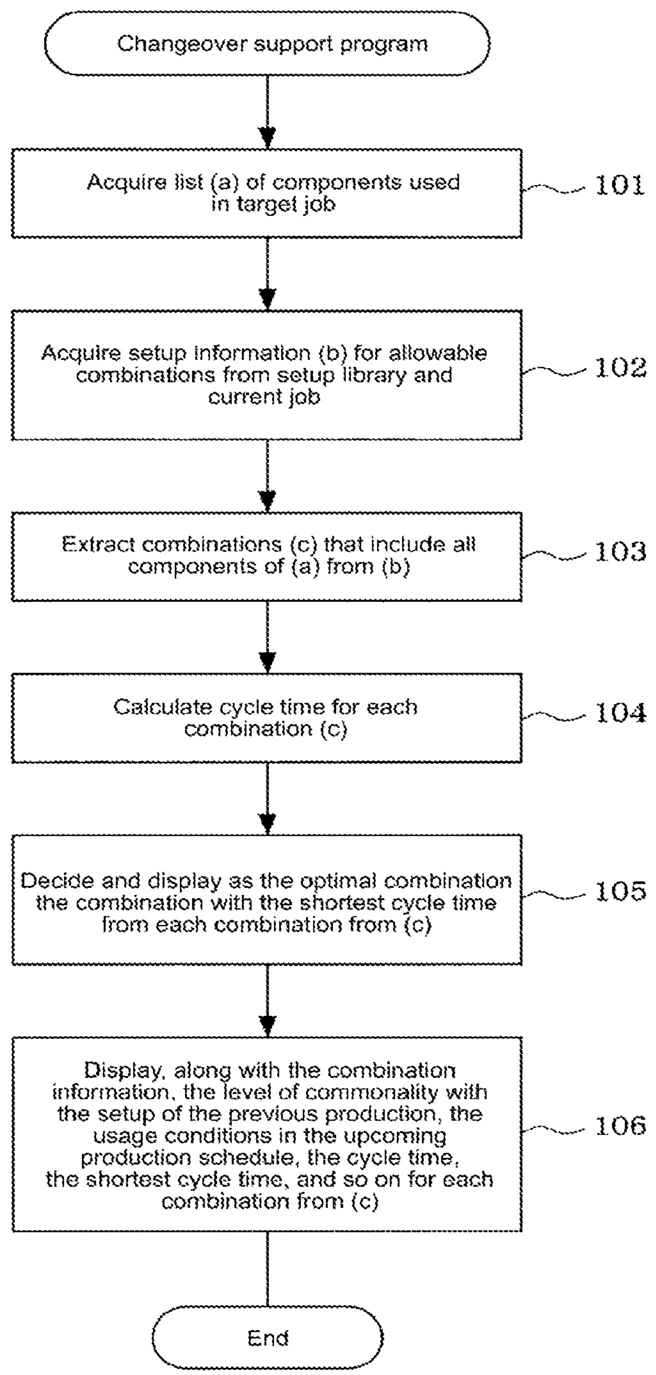
FIG. 3 is a flowchart illustrating the processing flow of a changeover support program.

Connected to production management computer 21 that manages production of component mounting line 10 are: input device 22 such as a keyboard, mouse, or touchscreen panel; memory device 23 (memorizing device) such as a hard disk, RAM, or ROM that memorizes various data such as setup information, and various programs such as the changeover support program of FIG. 3 that is described below; and display device 24 such as a liquid crystal display or CRT.

Batch exchange carts 18 set on each component mounter during changeover and multiple exchange-use batch exchange carts 18 are prepared at preparation space 25 adjacent to component mounting line 10. Multiple feeders 17 are loaded on each batch exchange cart 18. In the present embodiment, when loading multiple feeders 17 on batch exchange cart 18 in preparation space 25, information of components supplied by each feeder 17 is memorized on memory device 23 as setup information linked to identification information of batch exchange cart 18. Work of memorizing setup information on memory device 23 may be performed by an operator reading component information from a component information recording section (not shown) provided on the reel of component supply tape set on each feeder 17 using a reader or the like, reading identification information of batch exchange cart 18 from a cart information recording section (not shown) provided on batch exchange cart 18 using a reader or the like, and then sending the information to memory device 23 of production management computer 21 via a network such as a wireless LAN. The component information recording section and the cart information recording section may be a code label or the like on which information is recorded with a barcode, a 2D dimensional code, or the like, or may be an electronic tag or the like on which information is recorded electromagnetically. Alternatively, an operator may operate a mobile terminal or input device 22 of production management computer 21 to memorize identification information of the batch exchange cart 18 and component information of each feeder 17 on memory device 23 of production management computer 21.

Production management computer 21, by performing the changeover support program of FIG. 3 that is described later, functions as the changeover deciding device of the claims, and decides a combination of batch exchange carts 18 that includes all of the feeders 17 that supply components to be used in the post-changeover production (target job) from the multiple batch exchange units 18 prepared in preparation space 25 based on the component information of feeders 17 loaded on batch exchange carts 18 used in the pre-changeover production (current job) (that is, setup information of batch exchange carts 18 of the current job) and setup information of batch exchange carts 18 that can be used for exchange memorized in memory device 23 (that is, component information of feeders 17 loaded on batch exchange carts 18 in preparation space 25), and then notifies an operator of the decided combination of batch exchange carts 18 by sound or by the display of a mobile terminal or display device 24 of production management computer 21. Here, in a case in which there are multiple combinations of batch exchange units 18 that include all of the feeders 17 to be used in the post-changeover production, the production cycle time may be calculated for each of the combinations, and an optimal combination that is the combination with the shortest cycle time may be decided and notified to an operator via sound or display.

Figure 2:
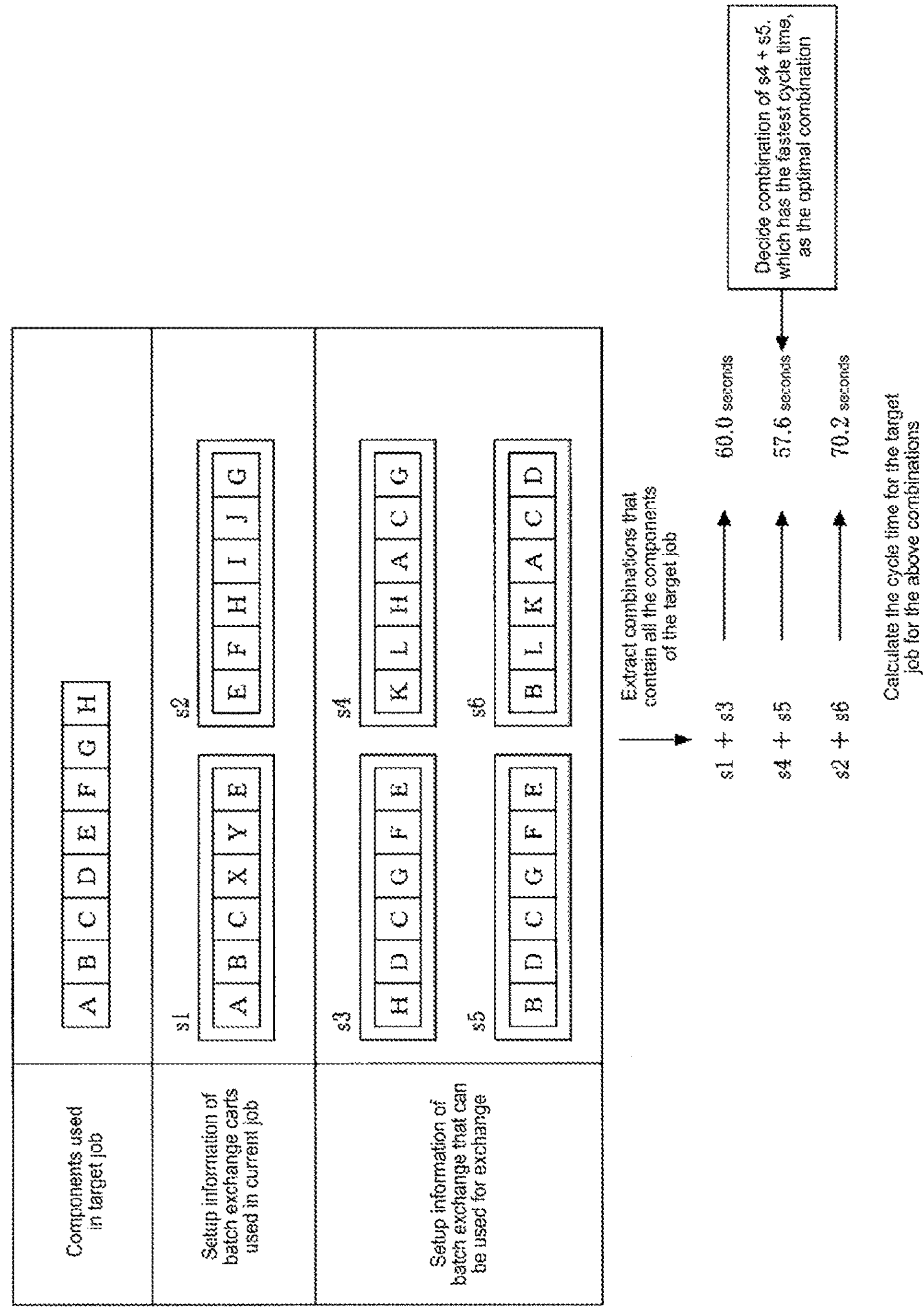
FIG. 2 illustrates a specific example of a component mounting line changeover support method.

Next, an example of changeover support of the present embodiment is described using FIG. 2. In the example of FIG. 2, there are components types A to H to be used in the target job (post-changeover production), and a combination of two batch exchange carts 18 to be used on two component mounters 13 is decided. The target job may be a single job or multiple jobs. Four batch exchange carts 18 are prepared in preparation space 25.

The setup information of the two batch exchange carts 18 used in the current job (pre-changeover production) is setup information s1 of a first batch exchange cart 18, which is "A, B, C, X, Y, E", and setup information s2 of a second batch exchange cart 18, which is "E, F, H, I, J, Q". Setup information of batch exchange carts 18 that can be used for exchange is the four sets of information s3 to s6 (that is, the setup information of the four batch exchange carts 18 in preparation space 25), with setup information s3 of the first batch exchange cart 18 being "H, D, C, G, F, E", setup information s4 of the second batch exchange cart 18 being "K, L, H, A, C, G", setup information s5 of the third batch exchange cart 18 being "B, D, C, G, F, E", and setup information s6 of the fourth batch exchange cart 18 being "B, L, K, A, C, D". There are six sets of setup information, s1 to s6, from which combinations can be made.

Production management computer 21, from the six sets of setup information s1 to s6, extracts combinations of setup information that include all components A to H that are to be used in the target job. In the example in FIG. 2, combinations of setup information that include all components A to H to be used in the target job are "s1+s3", "s4+s5", and "s2+s6". To select the optimal combination from these three combinations of setup information, the production cycle time is calculated for the three combinations of setup information, and the optimal combination that is the combination with the shortest cycle time is decided and notified to an operator via sound or display. In the example in FIG. 2, the cycle time of the first combination of "s1+s3" is 60.0 seconds, the cycle time of the second combination of "s4+s5" is 57.6 seconds, and the cycle time of the third combination of "s4+s5" is 70.2 seconds, therefore the optimal combination is decided as the second combination of "s4+s5".

The changeover support of the present embodiment as described above is performed as follows according to the changeover support program of FIG. 3 by production management computer 21 when changeover is required. When the changeover support program of FIG. 3 is started, first, in step 101, list (a) of components to be used in the target job is acquired. Next, proceeding to step 102, setup information (b) of batch exchange carts 18 that can be combined is acquired from the current job and setup library (library of setup information of batch exchange carts 18 that can be used for exchange) memorized on memory device 23 of production management computer 21.

Next, proceeding to step 103, from the setup information (b) of batch exchange carts 18 that can be used for exchange, combinations (c) of setup information that include all of the components to be used in the target job from list (a) are extracted. Next, proceeding to step 104, the production cycle time is calculated for each extracted combination (c) of setup information.

Next, proceeding to step 105, from each combination (c), the optimal combination that is the combination with the shortest cycle time is decided, and notified to an operator by sound or the display of a mobile terminal of the operator or display device 24. Next, proceeding to step 106, with respect to each combination (c), the level of commonality with the setup of the previous production, the usage conditions of batch exchange carts 18 in the upcoming production schedule, the cycle time, the shortest cycle time, and so on, along with the combination information, are notified to an operator by sound or by the display of a mobile terminal or display device 24, and the program ends.

The operator looks at the optimal combination displayed on the mobile terminal or display device 24, and from the multiple batch exchange carts 18 in preparation space 25, selects the optimal combination of batch exchange carts 18, and then exchanges the batch exchange cart 18 set on each component mounter 13.

According to the embodiment described above, a combination of batch exchange carts 18 that include all of the feeders 17 that supply components to be used in the post-changeover production (target job) is decided and notified to an operator from among the prepared exchange-use multiple batch exchange carts 18 based on the component information of feeders 17 loaded on batch exchange carts 18 used in the pre-changeover production (current job) (that is, setup information of batch exchange carts 18 of the current job) and setup information of batch exchange carts 18 that can be used for exchange memorized in memory device 23 (that is, component information of feeders 17 loaded on batch exchange carts 18 in preparation space 25), and then an operator is notified of the decided combination of batch exchange carts 18 by sound or by the display of a mobile terminal or display device 24 of production management computer 21, therefore it is not necessary to perform exchange work for individual feeders during changeover (that is, it is fine just to use existing units), and changeover can be performed by just performing batch exchange work of batch exchange carts 18, thereby improving productivity.

Further, with the present embodiment, in a case in which there are multiple combinations of batch exchange units 18 that include all of the feeders 17 to be used in the post-changeover production, the production cycle time is calculated for each of the combinations, and an optimal combination that is the combination with the shortest cycle time is decided and notified to an operator via sound or display, therefore it is possible to perform changeover work with the combination of batch exchange carts 18 with the shortest cycle time, thereby improving productivity.

Note that, with the above embodiment, descriptions were given of an embodiment of the present disclosure for exchange work of batch exchange of multiple feeders 17 using batch exchange carts 18 set on each component mounter 13, but in a case of automatic exchange of suction nozzles held by the mounting head of each component mounter 13 for the exchange-use suction nozzles loaded on nozzle changer 19, the present disclosure may also be applied to changeover work of exchanging nozzle changer 19 set on each component mounter 13. In this case, a combination of nozzle changers 19 that include all the suction nozzles to be used in the post-changeover production (target job) is decided from the multiple nozzle changers 19 prepared in the preparation space based on the information of suction nozzles loaded on nozzle changer 19 used in the pre-changeover production (current job) (that is, setup information of nozzle changer 19 of the current job) and setup information of nozzle changers 19 that can be used for exchange memorized in memory device 23 (that is, information of suction nozzles loaded on nozzle changer 19 in preparation space 25), and then an operator is notified of the decided combination of nozzle changers 19 by sound or by the display of a mobile terminal or display device 24 of production management computer 21. Here, in a case in which there are multiple combinations of nozzle changers 19 that include all of the suction nozzles to be used in the post-changeover production, the production cycle time may be calculated for each of the combinations, and an optimal combination that is the combination with the shortest cycle time is decided and notified to an operator via sound or display.

Further, it goes without saying that the component mounting line to which this disclosure is applied is not limited to the configuration of FIG. 1, and various changes may be made without departing from the gist of the disclosure, such as that the configuration may be just of multiple component mounters, or the quantity of component mounters, the types of mounting related machines (devices other than component mounters), and the arrangement of each machine may be changed appropriately.

REFERENCE SIGNS LIST

10: component mounting line; 11: circuit board; 12: conveyance line (conveyance path); 13: component mounter; 14: solder printer; 15: visual inspection device; 16: reflow device; 17: feeder; 18: batch exchange cart (batch exchange unit); 19: nozzle changer (batch exchange unit); 21: production management computer (changeover deciding device); 23: memory device (memorizing device); 24: display device; 25: preparation space

The invention claimed is:

1. A component mounting line changeover support system for a component mounting line that mounts components on a circuit board using multiple component mounters lined up along a conveyance path of a circuit board, the component mounting line changeover support system comprising:

a batch exchange unit set on each of the multiple component mounters, the batch exchange unit being configured for batch exchanging multiple feeders that supply components or multiple suction nozzles that pick up the components and mount the components on the circuit board;

multiple exchange-use batch exchange units to be exchanged with the batch exchange units set on the component mounters;

a memorizing device configured to memorize setup information that is information of feeders or suction nozzles loaded on each of the multiple exchange-use batch exchange units used in a pre-changeover production; and a changeover determining device configured to acquire a list of the feeders and suction nozzles to be used in a post-changeover target job, acquire the setup information from the memorizing device, extract combinations of the setup information that include all of the feeders and suction nozzles to be used in the post-changeover target job, calculate a production time for each extracted combination of the setup information, decide an optimal combination of the setup information with a shortest production time, and notify an operator of the optimal combination of batch exchange units that include all of the feeders or suction nozzles to be used in the post-changeover target job from among the multiple exchange-use batch exchange units.

2. The component mounting line changeover support system according to claim 1, wherein each of the batch exchange unit includes a cart provided with the feeders or suction nozzles.

3. A component mounting line changeover support method for a component mounting line that mounts components on a circuit board using multiple component mounters lined up along a conveyance path of a circuit board, the component mounting line changeover support method comprising:

setting a batch exchange unit on each of the multiple component mounters, the batch exchange unit being configured for batch exchanging multiple feeders that supply components or multiple suction nozzles that pick up the components and mount the components on the circuit board;

preparing multiple exchange-use batch exchange units to be exchanged with the batch exchange units set on the component mounters;

memorizing on a memorizing device setup information that is information of feeders or suction nozzles loaded on each of the multiple exchange-use batch exchange units used in a pre-changeover production;

acquiring a list of the feeders and suction nozzles to be used in a post-changeover target job;

acquiring the setup information from the memorizing device;

extracting combinations of the setup information that include all of the feeders and suction nozzles to be used in the post-changeover target job;

calculating a production time for each extracted combination of the setup information, deciding an optimal combination of the setup information with a shortest production time; and notifying the optimal combination of batch exchange units that include all of the feeders or suction nozzles to be used in the post-changeover target job from among the multiple exchange-use batch exchange units.

4. The component mounting line changeover support method according to claim 3, wherein each of the batch exchange unit includes a cart provided with the feeders or suction nozzles.

* * * * *